(12) United States Patent
Finlay et al.

(10) Patent No.: US 6,617,928 B2
(45) Date of Patent: Sep. 9, 2003

(54) CONFIGURABLE POWER AMPLIFIER AND BIAS CONTROL

(75) Inventors: Hugh J. Finlay, Moorpark, CA (US); Mark Bloom, Chandler, AZ (US); Thomas Fowler, Moorpark, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 09/971,523

(22) Filed: Oct. 5, 2001

(65) Prior Publication Data

US 2002/0084853 A1 Jul. 4, 2002

Related U.S. Application Data

(60) Provisional application No. 60/238,846, filed on Oct. 6, 2000.

(51) Int. Cl.[7] .................................................. H03F 3/04
(52) U.S. Cl. .................... 330/288; 330/285; 330/296
(58) Field of Search ............................ 330/288, 296, 330/257, 277, 285; 323/313, 314

(56) References Cited

U.S. PATENT DOCUMENTS

| | | | | |
|---|---|---|---|---|
| 5,432,473 A | * | 7/1995 | Mattila | 330/133 |
| 5,777,518 A | * | 7/1998 | Bailey | 330/296 |
| 6,043,714 A | * | 3/2000 | Yamamoto et al. | 330/296 |
| 6,130,579 A | * | 10/2000 | Lyer et al. | 330/285 |
| 6,194,968 B1 | * | 2/2001 | Winslow | 330/289 |
| 6,259,324 B1 | * | 7/2001 | Antognetti et al. | 330/296 |
| 6,333,677 B1 | * | 12/2001 | Dening | 330/296 |
| 6,437,647 B1 | * | 8/2002 | Lower | 330/288 |

* cited by examiner

*Primary Examiner*—Brian Young
*Assistant Examiner*—John Nguyen
(74) *Attorney, Agent, or Firm*—Thomas, Kayden, Horstemeyer & Risley LLP

(57) ABSTRACT

The bias control selectively provides for bias of a power amplifier based upon a bandgap voltage generated by the bias control, or by a bias voltage external to the bias control. A controller controls the selection of either the bandgap voltage or external bias voltage. The bias control is fabricated in a first semiconductor material capable of operating at low voltage supply levels, such as complementary metal oxide semiconductor (CMOS) material and may be fabricated on an integrated circuit common with a power amplifier.

22 Claims, 8 Drawing Sheets

CONFIGURABLE POWER AMPLIFIER AND BIAS CONTROL

CROSS-REFERENCE TO RELATED APPLICATION

This application claims priority to copending U.S. provisional application entitled, "CONFIGURABLE POWER AMPLIFIER BIAS CONTROL," having ser. No. 60/238,846, filed Oct. 6, 2000, and to copending U.S. utility patent application entitled "CONSTANT CURRENT BIASING CIRCUIT FOR LINEAR POWER AMPLIFIERS," filed on Oct. 21, 2000, and accorded Ser. No. 09/693,398, the disclosures of which are both incorporated herein, in their entirety, by reference.

BACKGROUND OF THE INVENTION

1. Technical Field

This invention relates generally to maximizing the efficiency of radio frequency power amplification in a wireless communication device transmitter, and, more particularly, to a high efficiency multiple power level amplifier.

2. Related Art

With the increasing availability of efficient, low cost electronic modules, mobile communication systems are becoming more and more widespread. For example, there are many variations of communication schemes in which various frequencies, transmission schemes, modulation techniques and communication protocols are used to provide two-way voice and data communications in a handheld telephone-like communication handset. While the different modulation and transmission schemes each have advantages and disadvantages, one common factor is the need for highly efficient power amplification. As these communication devices become smaller and smaller, the functionality provided by these devices continues to increase. One major concern when developing these handheld communication devices is power consumption. As the devices become smaller and smaller, the amount of power consumed and dissipated becomes more and more critical. High efficiency power amplification decreases the amount of power consumed, thereby maximizing battery life of the device.

Another major concern in these wireless devices is the size of the circuitry. In order to minimize the hardware required it is desirable to integrate as much functionality as possible into fewer and fewer circuit modules. This enables the handheld device to be smaller and consume less power.

Many wireless power amplifier applications require high efficiency over a broad range of operating power levels. This is inherently difficult to achieve without circuitry and logic in addition to the power amplifier. Typically, additional circuitry residing on a control die must be used in addition to the power amplifier circuit.

FIG. 1 is a simplified block of a typical transceiver 50. Transceiver 50 includes a bias circuit 100, a power amplifier 120 and a voltage regulator 140. Bias circuit 100 maintains a constant current $I_B$ to power amplifier 120 based upon a reference voltage $V_{ref}$ provided to the bias circuit 100 by the voltage regulator 140.

Bias control systems to control the level of voltage bias applied to a power amplifier, and thus the level of power consumed by the power amplifier during operation, are often used in conjunction with wireless communications devices incorporating power amplifiers. One example of such a bias control system is illustrated in FIG. 2. In this example, an emitter follower bias circuit 100 is illustrated. The emitter follower bias circuit 100 provides a base current $I_B$ required by a radio frequency (RF) power amplifier 120, and more particularly, RF transistor 32 for direct current (DC) bias and RF power conditions. Both emitter follower bias circuit 100 and power amplifier 120 are typically implemented using the same semiconductor technology, for example, gallium arsenide (GaAs) heterojunction bipolar transistor (HBT).

One of the primary disadvantages of this type of common bias control system when implemented using GaAs HBT technology is that due to the two base emitter voltage drops across buffer transistor 30 and RF transistor 32, respectively, $V_{ref}$ must be greater than +3.0V to maintain adequate operation over the operating temperature range as the base to emitter voltage drop $V_{BE}$ of each of these transistors is approximately +1.3 volts each. However, in many communications devices, such as mobile cellular or PCS telephones, batteries are used to provide a supply voltage to the communications device. These batteries are typically configured to provide a minimum operating voltage of +2.8 VDC. Communications devices are often configured to shut off when the available supply voltage falls below +2.8 volts DC (VDC). Once the available battery voltage drops below +3.0 VDC, it is necessary for steps to be taken to boost the sub +3.0 VDC operating voltage supplied by the battery up so that the voltage supplied to the communications device as VDC is the required +3.0 volts. This requires additional circuitry to boost the sub +3.0 VDC voltage and provide a regulated voltage to the communications device that is greater than the minimum battery voltage.

Further, as an external voltage is typically required to provide a reference voltage $V_{REF}$ to the bias circuit 100, an external input 49 is provided to connect an external voltage supply to the bias circuit 100. In RF communications devices, electrostatic discharge (ESD) can damage the circuitry of the communications device. ESD may be propagated through the circuitry of the communications device via connections between circuitry/components. The presence of an external input 49 reduces the reliability of the bias circuit 100, as well as the communications device 150 in general, as it increases the risk of ESD being picked up and propagated through the bias circuit 100, thereby potentially damaging the bias circuit 100 and/or power amp 120. GaAs HBT technology typically provides resistance to ESD of up to ±1 kilovolt (1 KV). ESD exceeding ±1 KV is common and jeopardizes circuitry of the communications device.

Additionally, in the communications device 150, the base current $(I_B)_{RF}$ provided to the RF transistor 32 of power amplifier 120 is prone to shift as the power required by RF transistor 32 increases/decreases. Thus, in order to compensate for such shifting in bias current, it is common to provide a higher bias voltage to the base of the RF transistor 32. This leads to lower efficiency, greater consumption of power and the need for a higher supply voltage.

The bias circuit 100 is typically configured to provide a quiescent current $(I_B)$ to the RF transistor 32 that allows for maximum gain and linearity at the maximum RF output power level. However, at low power levels this fixed quiescent current is higher than necessary for proper operation at the lower power levels. As a result the efficiency of the power amp 120 diminishes at lower RF output levels.

The voltage at node 34 is established by the base-to-emitter drop of the mirror transistor 26 and the buffer transistor 30. The voltage at node 34 establishes the reference current $I_{ref}$ which flows through the resistor $R_{ref}$. As the base to emitter voltage drop of a transistor fluctuates as temperature fluctuates any changes in temperature impact the voltage at node 34. Thus, as the temperature changes and the base to emitter voltages across mirror transistor 26 and buffer transistor 30 change, the voltage at node 34 changes. This results in the current $I_{ref}$ also changing. As $I_{ref}$ varies so will the output current $I_C$ at RF transistor 32. Unfortunately, as the current $I_C$ decreases so does the linearity of RD transistor 32.

Therefore, there is a need in the industry for a wireless power amplification circuit that achieves highly efficient power amplification over a broad range of output power levels and that is economical to produce in high volume.

SUMMARY

The present invention provides a system for biasing a power amplifier in a communications device. Briefly described, in architecture, the system can be implemented as follows. A band gap voltage generator for generating a bandgap voltage is provided to a voltage-to-current converter. The voltage-to-current converter generates a reference current in accordance with the bandgap voltage. The reference current is provided to a programmable current mirror that multiplies the reference current to a predetermined level. A feedback amplifier is provided for outputting and maintaining a constant current to a reference device.

Related methods of operation and computer readable media are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The components in the figures are not necessarily to scale, emphasis instead being placed upon clearly illustrating the principles of the invention. Moreover, in the figures, like reference numerals designate corresponding parts throughout the different views.

DETAILED DESCRIPTION

The configurable bias control 300 can be implemented in any system where it is desirable to provide for bias of a power amplifier without using an externally regulated voltage or current source, and while minimizing the power drain on a power source such as a battery by adjusting the bias level as a function of required output power.

The bias control of the present invention provides a supply voltage independent and temperature compensated voltage bias $V_{BIAS}$ to a power amplifier device. It also provides a current source with feedback circuitry capable of supplying a variable current to a power amplifier depending upon the radio frequency (RF) drive voltage applied to the power amplifier.

Figure 1:
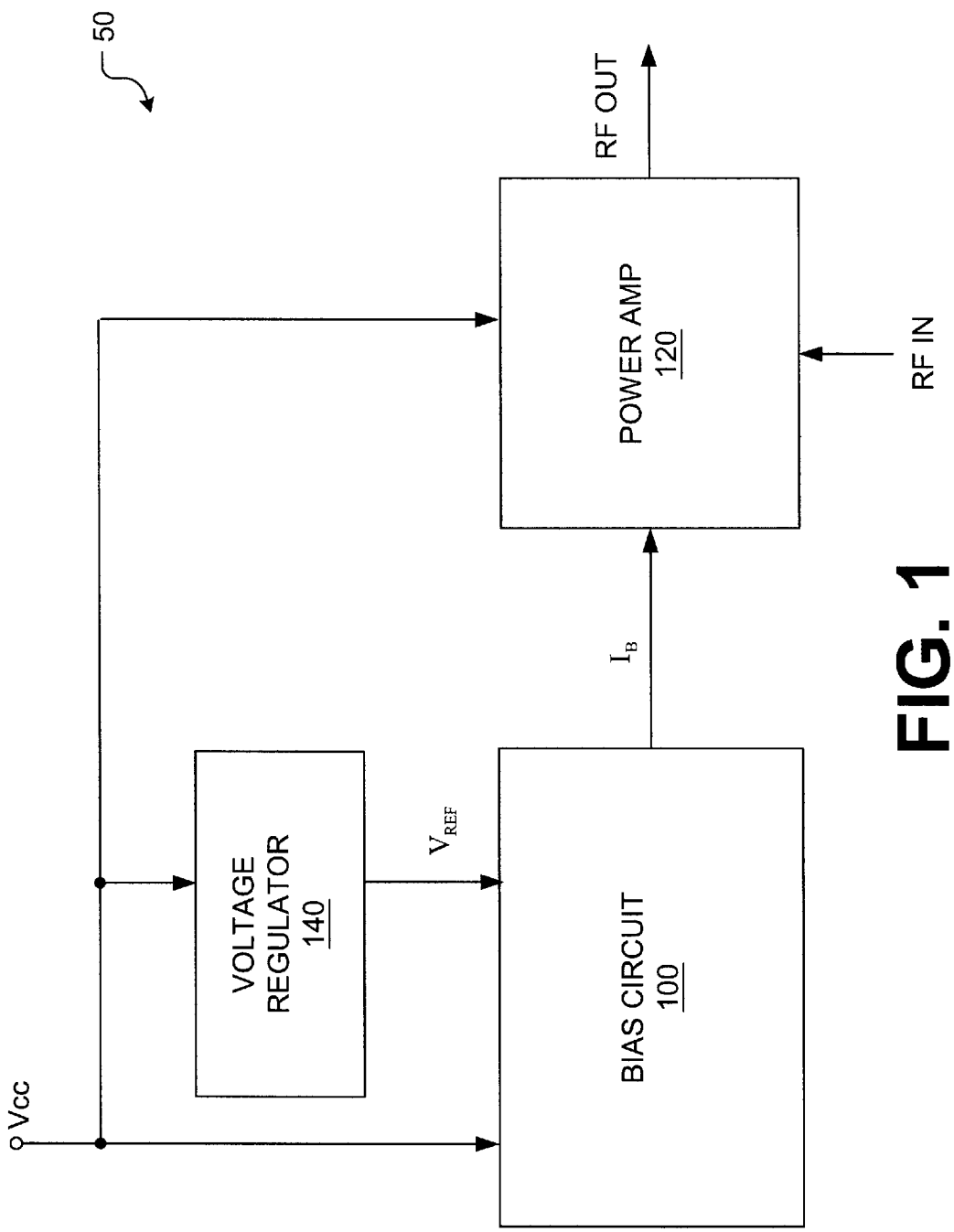
FIG. 1 is a block diagram illustrating a simplified portable transceiver.
Figure 2:
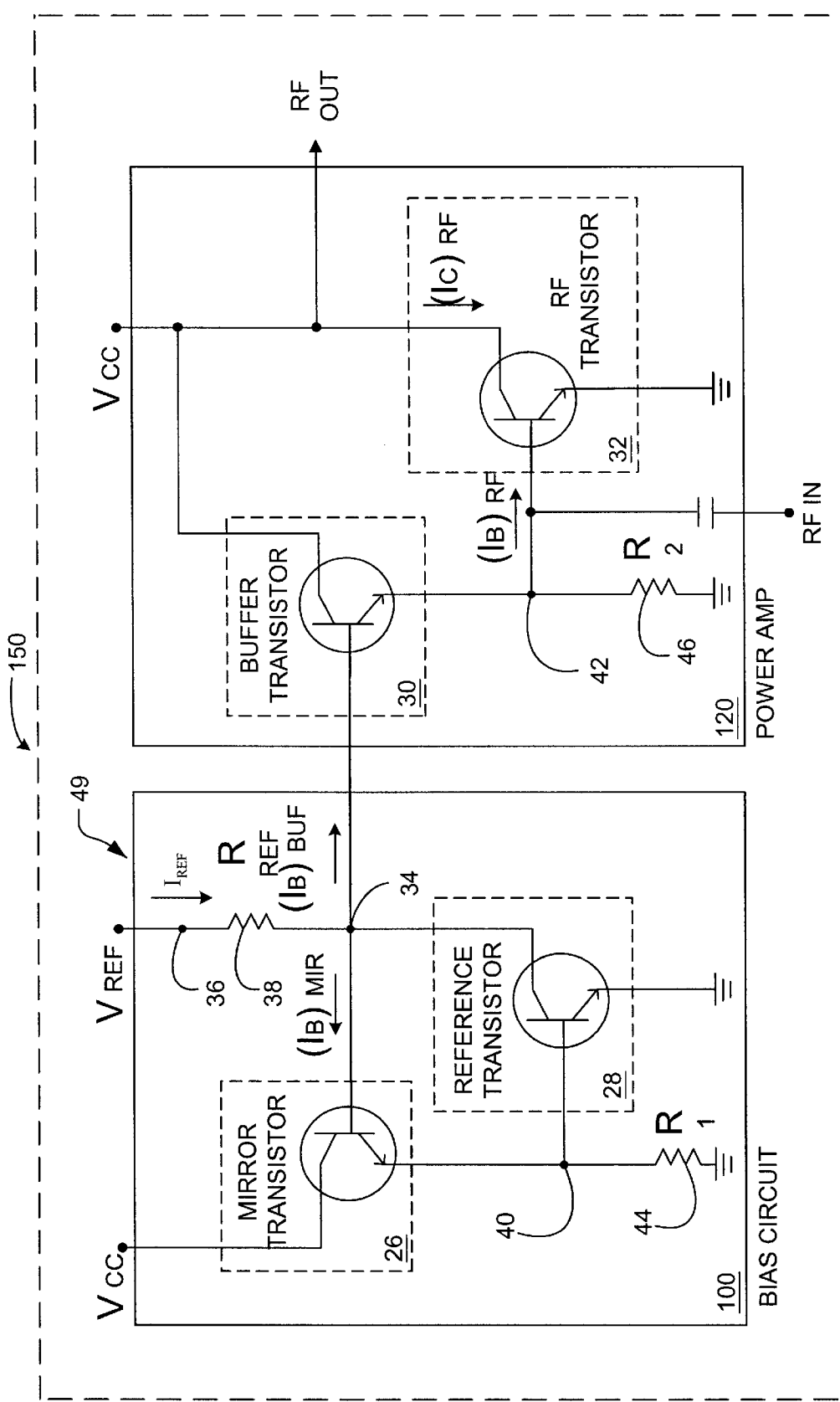
FIG. 2 is a block diagram illustrating the power amplifier of FIG. 1.
Figure 3:
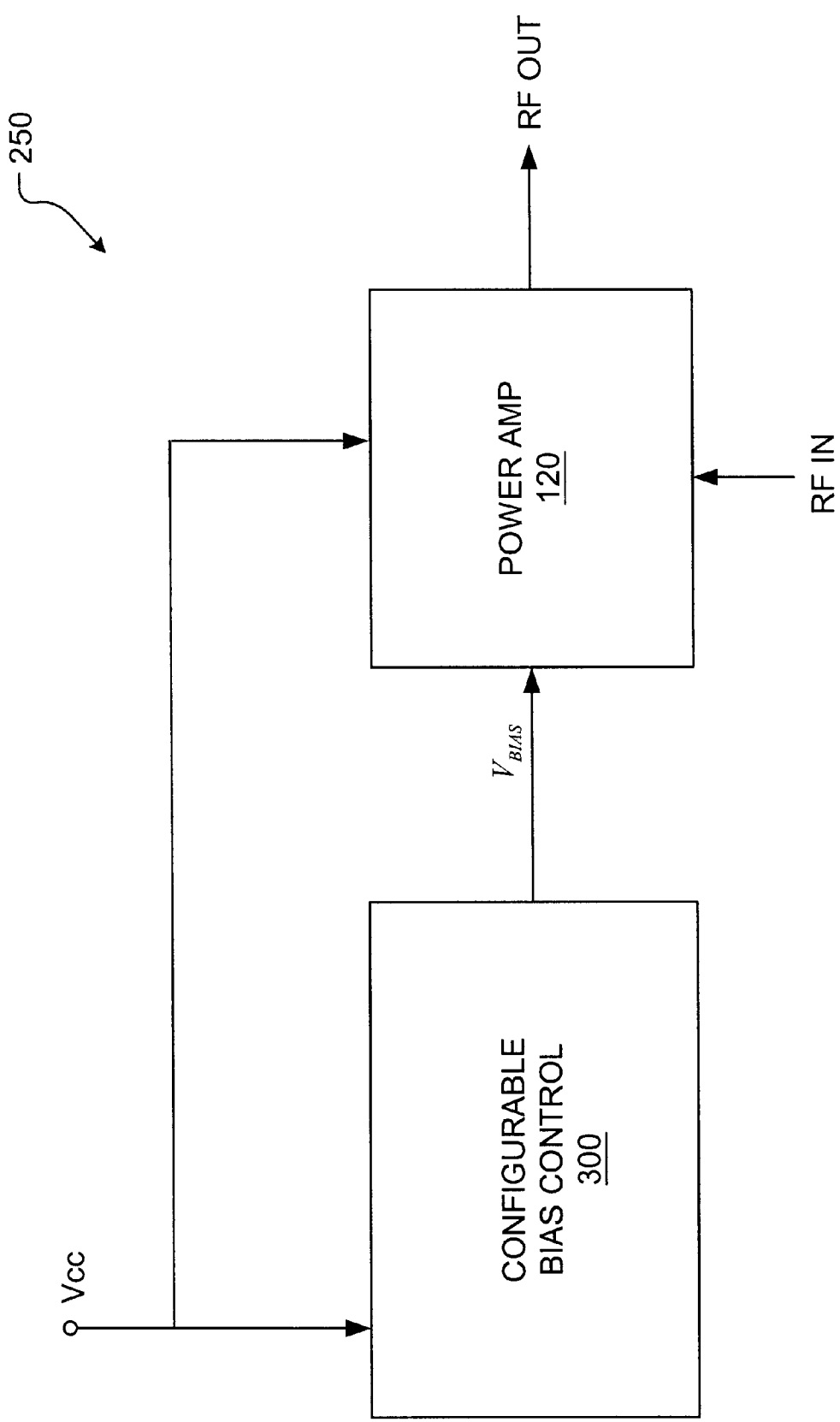
FIG. 3 is a block diagram illustrating a communications device 250 having a configurable bias control.

FIG. 3 shows a simplified block diagram illustrating a communications device 250. Although not shown, communications device 250 may be configured to include, for example, a transmitter or receiver, or both, for cellular or personal communications system (PCS) communications or a combination thereof. Further, communications device 250 may be configured to include a global positioning system (GPS) receiver.

Configurable bias control unit 300 provides a bias Voltage ($V_{BIAS}$) to a power amplifier 120. Both configurable bias control unit 300 and power amplifier 120 are provided a supply voltage Vcc. The supply voltage Vcc may be provided by an external power source such as, for example, a battery or power supply. Power amplifier 120 is configured to amplify a radio frequency (RF) signal RF IN, and output an amplified radio frequency signal RF OUT. The signal RF IN may be provided by, for example, a radio frequency baseband processing circuit (not shown) that may also be incorporated into communications device 250.

Figure 4:
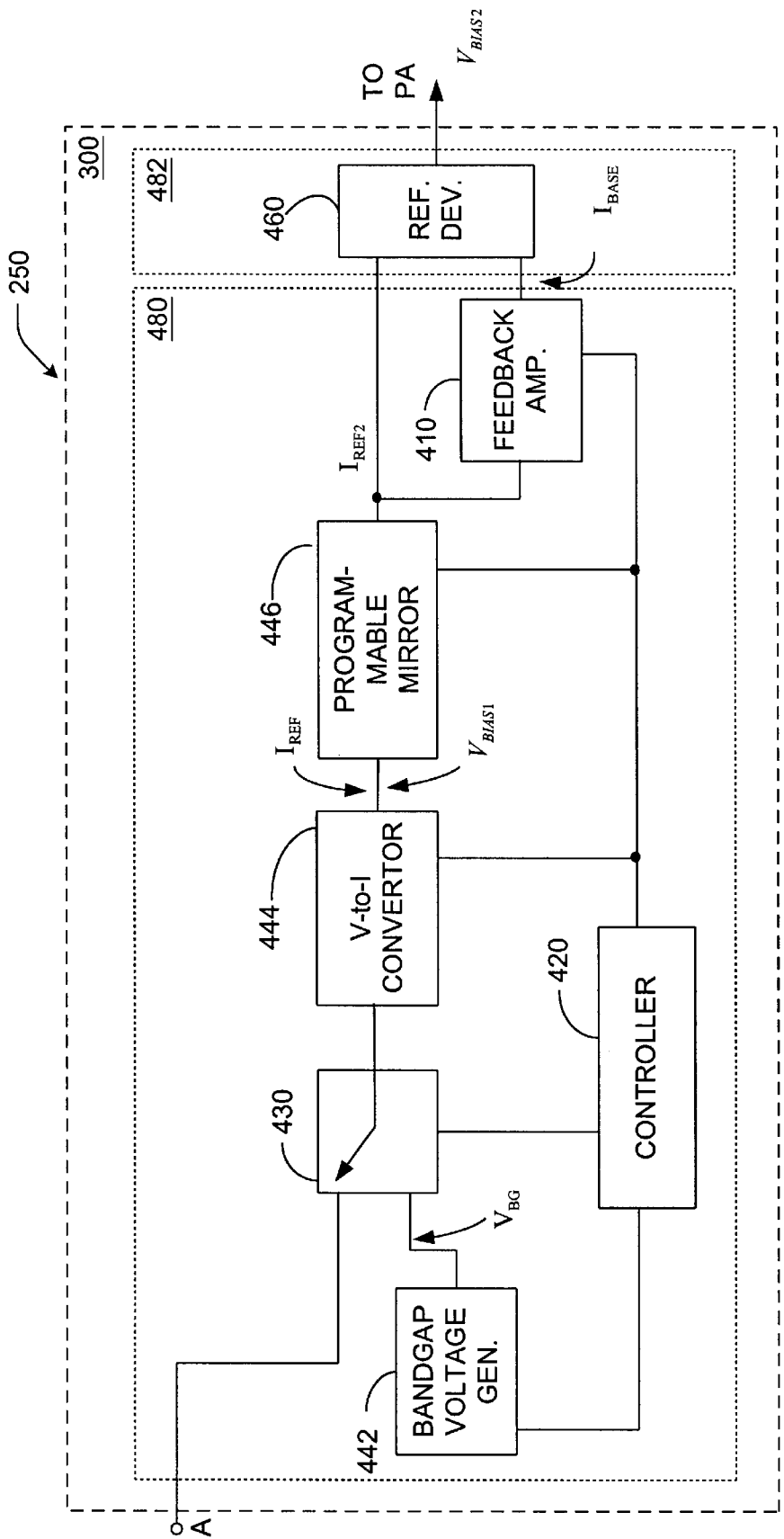
FIG. 4 is a block diagram illustrating configurable bias control 300.

FIG. 4 provides a further illustration of configurable bias control unit 300. It can be seen that configurable bias control unit 300 includes a feedback amplifier 410, controller 420, switch 430, bandgap voltage generator 442, voltage-to-current converter (V-to-I converter) 444, programmable current mirror (programmable mirror) 446 and reference device 460. Although not shown, each of these components is preferably supplied with a supply voltage Vcc.

Configurable bias control unit 300, with the exception of reference device 460, is preferably fabricated in a first semiconductor material 480. Similarly, reference device 460, as well as power amplifier unit 120 (FIG. 3), is preferably fabricated in a second semiconductor material 482. The first semiconductor material may be chosen so that circuitry fabricated therein will require a low operating voltage, compared to GaAs semiconductor technology in order to function. Further, the first semiconductor material may be chosen to provide resistance to ESD greater than 1 KV. The second semiconductor material may be chosen to provide for high power dissipation capabilities.

In one embodiment, power amplifier 120 (FIG. 3) and reference device 460 are fabricated in gallium arsenide (GaAs) semiconductor material while feedback amplifier 410, controller unit 420, bandgap voltage generator 442, V-to-I converter 444, and programmable mirror 446 are fabricated in complimentary metal oxide semiconductor (CMOS) material. As CMOS circuitry is capable of operating at a low voltage, such as, for example, 2.5 volts DC, the bias controller 300 may be implemented without the need for a voltage boosting circuit to boost the supply voltage Vcc in the case where it should drop below a certain level, such as, for example, +3.0 VDC. Further, costs can be reduced by using CMOS material to fabricate components of the configurable bias controller 300.

Power amplifier 120 and reference device 460 may be fabricated in GaAs semiconductor material and included on a single integrated circuit and placed on a single integrated circuit along with components of the bias control unit 300 that are fabricated in CMOS. Alternatively, power amplifier 120 and reference device 460 may be fabricated in GaAs semiconductor material and placed on an integrated circuit separate and distinct form an integrated circuit on which the components of bias control 300 are fabricated in CMOS.

The bandgap voltage generator 442 is configured to provide a stable voltage $V_{BG}$, independent of temperature or source voltage Vcc, to the V-to-I converter 444. The V-to-I converter 444 converts the voltage $V_{BG}$ into a reference current $I_{REF}$. This reference current $I_{REF}$ is provided to the programmable mirror 446 that mirrors the current $I_{REF}$ and selectively multiplies the current $I_{REF}$ by a predetermined amount so as to increase the reference current available at the output as $I_{REF2}$. The reference current $I_{REF2}$ is provided to reference device 460.

Bandgap voltage generator 442 may be configured in accordance with well-known bandgap voltage generator principles and configurations. Some examples of such bandgap voltage generators appear in *CMOS Circuit Design, Layout, and Simulation*, R. Jacom Baker, Harry W. Li, David E. Boyce, pp. 469–479, (1998) and in *Analysis and Design of Analog Integrated Circuits*, Paul R. Gray and Robert G. Meyer, page 345, (1993). The bandgap voltage $V_{BG}$ generated by the bandgap voltage generator 442 is fed to the V-to-I converter 444 via switch 430.

Switch 430 is preferably configured to alternatively provide V-to-I converter 444 with either a bias voltage provided by an external bias source (not shown) and received via input A, or a bandgap voltage $V_{BG}$ provided by the bandgap voltage generator 442. Controller 420 controls the switch 430 in accordance with input from a predetermined input or source. In another embodiment of configurable bias controller 300, switch 430 is not included and there are no provisions for receiving an external bias voltage.

Figure 5:
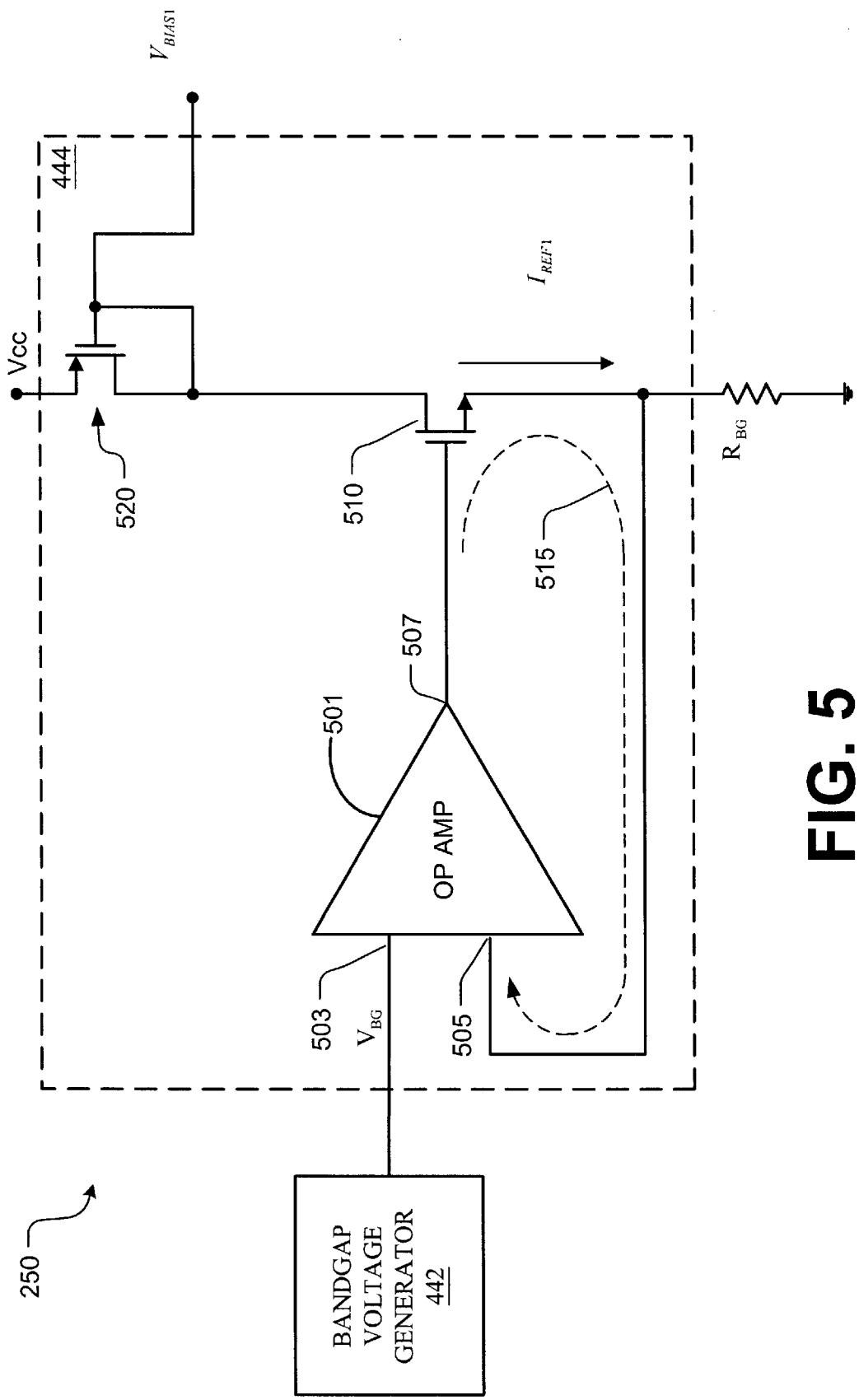
FIG. 5 is a block diagram illustrating a voltage-to-current converter 444.

FIG. 5 is a diagram illustrating an embodiment of V-to-I converter 444. V-to-I converter 444 is configured as an operational amplifier 501 having a first input 503 and second input 505 and an output 507. Other examples of suitable V-to-I converter configuration are disclosed and described in *Analysis and Design of Analog Integrated Circuits*, Paul R. Gray and Robert G. Meyer, page 345, (1993). The input 503 of op-amp 501 receives the voltage $V_{BG}$ from the bandgap voltage generator 442. The output 507 is connected to the gate of a negative field effect transistor (NFET) 510. The voltage $V_{BG}$ is forced across the resistor $R_{BG}$. The current $I_{REF}$ flows through the resistor $R_{BG}$ and FET 520, thereby generating a voltage drop between the source and drain of the FET 520. This voltage is output from the V-to-I converter 444 as $V_{BIAS1}$. An external resistor $R_{BG}$ is connected to the output of op-amp 501 via the NFET 510. The NFET 510, in conjunction with the feedback loop 515 and resistance $R_{BG}$ act to set the constant reference current $I_{REF}$. The feedback loop 515 acts to force the voltage $V_{BG}$ across resistor $R_{BG}$ thereby generating a constant current $I_{REF1}$ that is independent of temperature and the voltage supply Vcc. This current $I_{REF1}$ flows through positive field effect transistor (PFET) 520 thereby producing a bias voltage $V_{BIAS1}$ at the drain of PFET 520 that is output to programmable mirror 446 (FIG. 6).

Programmable current mirror 446 provides for the output of a current $I_{REF2}$ to the reference device 460 (FIG. 4). Programmable current mirror 446 is preferably configured to be controllable via controller 420 (FIG. 4).

Figure 6:
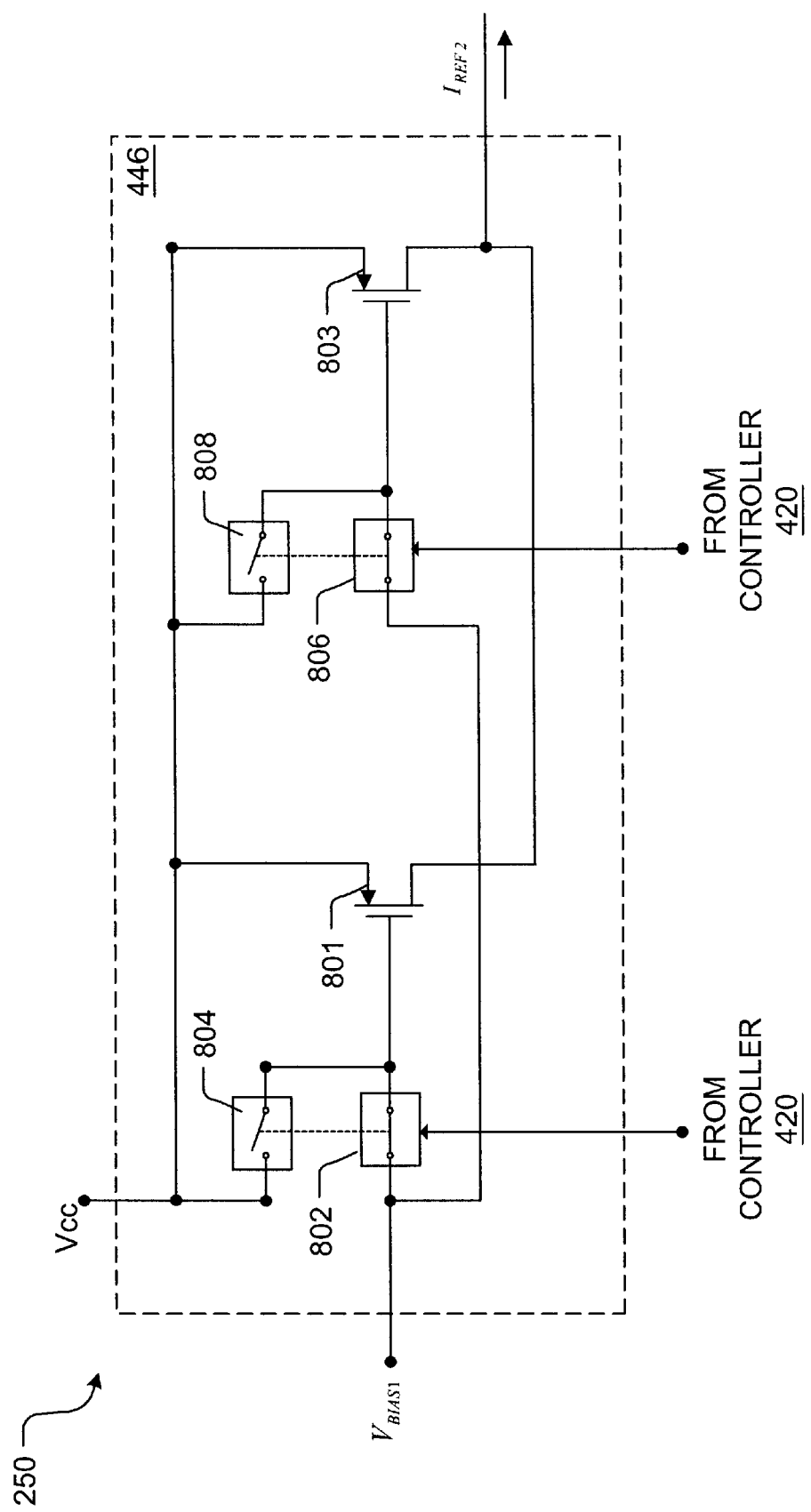
FIG. 6 is a block diagram illustrating programmable mirror unit 446.

FIG. 6 is a block diagram illustrating an example of a programmable mirror 446. Programmable mirror 446 includes PFET 801, PFET 803 switches 802 and 804 and switches 806 and 808. PFET 801 makes up a first current cell. PFET 803 makes up a second current cell.

PFET 801 is configured to receive either supply voltage Vcc or voltage $V_{BIAS1}$ from the V-to-I converter 444 at the base. The application of supply voltage Vcc and/or $V_{BIAS1}$ is controlled via switches 802 and 804. Switches 802 and 804 are controlled via input from controller 420 (not shown). Similarly, PFET 803 is configured to receive either supply voltage Vcc or voltage $V_{BIAS1}$ from the V-to-I converter at the base. The application of supply voltage Vcc and/or $V_{BIAS1}$ is controlled via switches 802 and 804. Switches 806 and 808 are controlled via input from controller 420 (not shown). Switch 802 is configured to be open when switch 804 is closed and vice-a-versa. Similarly, switch 806 is configured to be open when switch 808 is closed and vice-a-versa. In this example, switches 802 and 804 are set so as to allow the voltage $V_{BIAS1}$ from V-to-I converter 444 to be fed to the gate of PFET 801. Further, switches 806 and 808 are set so as to turn off the PFET 803. Switches 802, 804, 806 and 808 are preferably configured as FET switches.

The PFETs 801 and 803 are configured to receive the voltage $V_{BIAS1}$ (FIG. 5) thus generating a current through each of the PFETs 801 and/or 803. This current is equal to the current $I_{REF}(f)$ where f is a multiplier factor. The multiplier factor corresponds to the level of multiplication (amplification) that the PFET will apply to the current $I_{REF}$. The multiplier factor f may be determined by the physical semiconductor area dedicated to fabricate the PFET 801 or 803, in for example, CMOS material. The greater the area dedicated to the FET, the greater the multiplier factor f.

Where both current cells are connected to receive the bias voltage $V_{BIAS1}$ from the V-to-I converter 444, the output current $I_{REF2}$ of programmable mirror 446 will be equal to the sum of the currents through the PFETs 801 and 803. Programmable mirror 446 is configured to multiply (amplify) the current $I_{REF1}$ by a predetermined amount based upon input from controller 420. This multiplication of the current $I_{REF1}$ is accomplished by selectively switching PFETS 801 and/or 803 in line to receive the voltage $V_{BIAS1}$ from the V- to-I converter 444. Each PFET 801 and 803 provides for a predetermined amount of current amplification. As each PFET 801 and/or 803 is switched in line the current $I_{REF2}$ is increased by a predetermined increment. These PFETS may be selectively switched in so as to provide for incremental steps in the increase of the output current $I_{REF2}$ as may be needed to provide proper bias voltage $V_{BIAS}$ to the power amplifier 120 (FIG. 3). Additional PFETS may be included in the programmable mirror 446 to allow for further increase in the current $I_{REF2}$ resolution.

Figure 7:
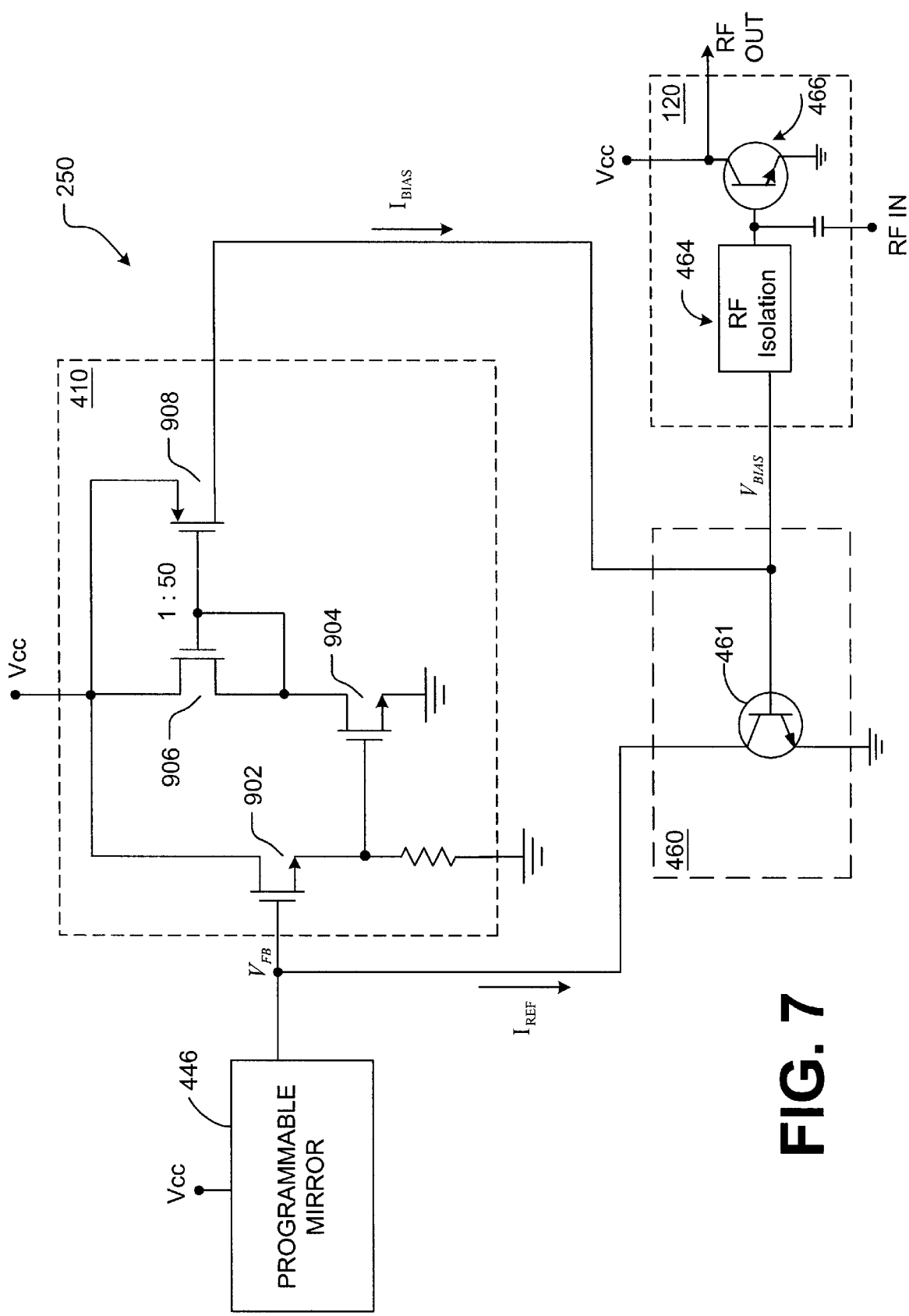
FIG. 7 is a block diagram illustrating feedback amplifier 410.

FIG. 7 is a block diagram illustrating an embodiment of feedback amplifier 410. The feedback amplifier 410 is configured to provide a constant current $I_{BIAS}$ to the reference device 460 and to the power amplifier 120. The feedback amplifier 410 includes a field effect transistor (FET) source follower amplifier 902, an FET common source amplifier 904, and a current mirror composed of FET 906 and 908. The feedback amplifier 410 is further configured to sense a voltage $V_{FB}$ at the collector of the reference transistor 461 and cause a corresponding current $I_{BIAS}$ to flow to reference device 460. Feedback amplifier 410 may be implemented using well know circuits such as an operational trans-conductance amplifier, an operational amplifier (OP-AMP), a source follower circuit or emitter-follower circuit, for example.

The gate of the source follower amplifier 902 is connected to the collector of the reference device 460. In this example, reference device 460 is implemented as a reference transistor 461. The gate to source voltage of the source follower 902 in addition to the gate to source voltage of the common source amplifier 904 act to keep a voltage $V_{FB}$ on the collector of the reference transistor 461 that is above a predetermined voltage level, for example, +1.5V nominally.

The current through common source amplifier 904 controls the current through the FET 906 and the FET 908. The FET 906 is preferably configured as a diode connected FET that controls the current IBIAS source by the FET 908. The current mirror composed of FET 906 and FET 908 may be configured to have, for example, a 1:50 current multiplying ratio. The mirror 908 in turn, supplies current $I_{BIAS}$ to the base of the reference device 461 and to the feedback amplifier 410.

As radio frequency (RF) input power is increased to the power amplifier 120, the collector current of power transistor 466 increases. This requires the feedback amplifier 410 to increase current $I_{BIAS}$ to the reference device 460 and the power amplifier 120. More particularly, the current $I_{BIAS}$ is increased to the base of reference transistor 461 and to transistor 466. As this happens, the voltage $V_{FB}$ at the gate of voltage source follower 902 increases, thus forcing the gate of common source amplifier 904 to increase.

Feedback amplifier 410 is preferably configured so that the voltage $V_{FB}$ does not exceed a level that would cause the FET 801 and FET 803 of the programmable mirror 446 to move out of saturation.

Controller 420 controls certain functions of the configurable bias control 300 based upon input from external sources, such as a power management circuit, baseband processing circuitry or other logic controls (FIG. 4). Controller 420 may be configured to control the functions of the configurable bias control 300, based upon information stored in memory associated with the controller 420. For example, controller 420 may be configured as a truth table or look up table (LUT) that specifies a particular output for a given input.

Controller 420 may be configured to control the on/off state of the bandgap voltage generator 442, the V-to-I converter 444, the programmable mirror 446 and the feedback amplifier 410. In other words, the controller 420 may be configured to turn power to these components on or off as may be desired. In one embodiment this may be carried out for the purpose of reducing power consumed by the configurable bias control 300 and power amplifier 120 when these components are not needed for operation of the communications device 250. Further controller 420 may also be configured to control switch 430.

Figure 8:
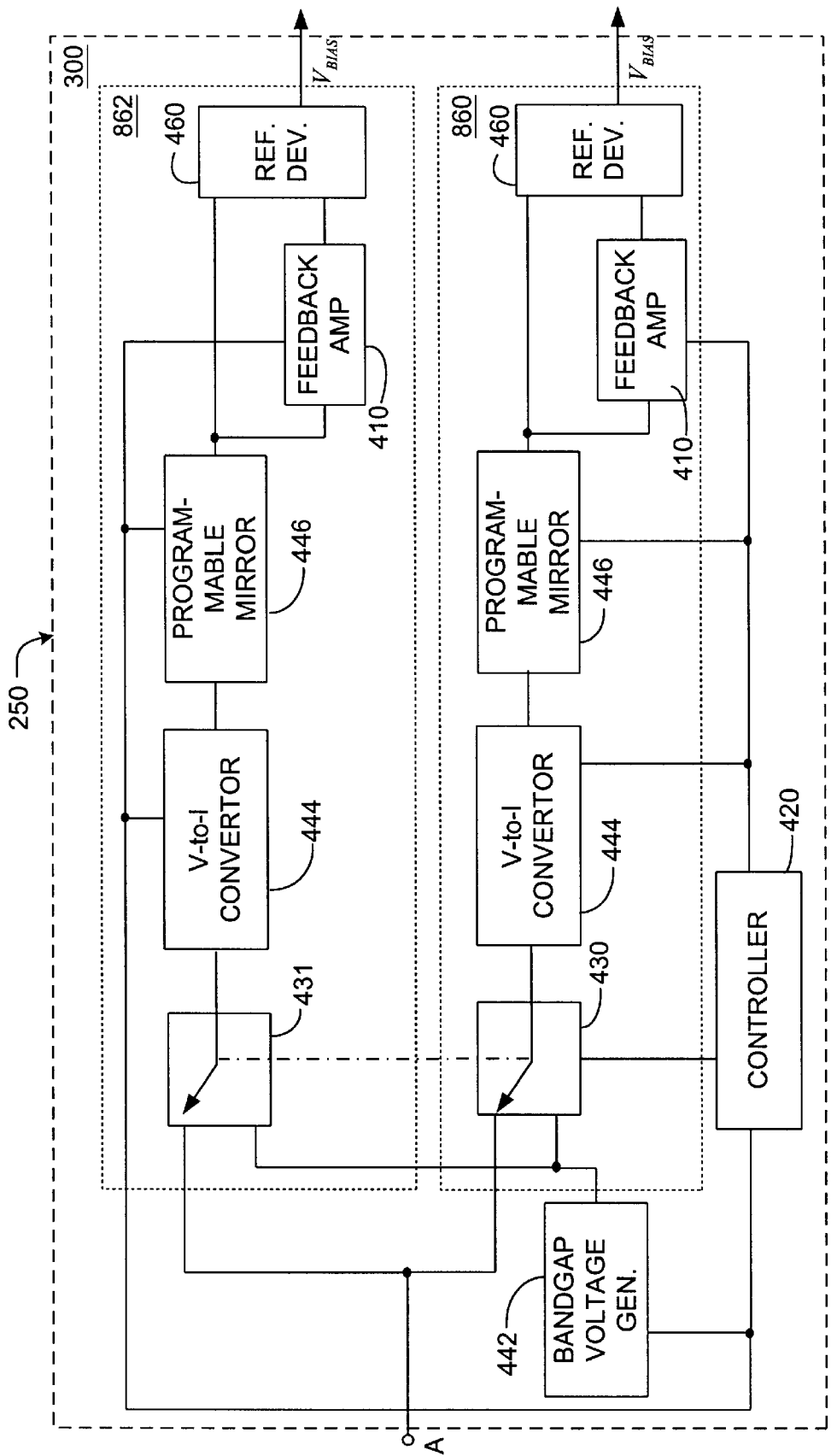
FIG. 8 is a block diagram illustrating a further embodiment of configurable bias control 300.

FIG. 8 is a block diagram illustrating a further embodiment of configurable bias controller 300. In this embodiment, configurable bias controller 300 is configured so as to include circuitry to provide the bias voltage ($V_{BIAS}$) to two separate power amplifiers or power amplifier stages. In this embodiment, two sections 860 and 862 are provided. Each section, 860 and 862, is identical in that each one includes a switching unit 430 and 431, respectively, as well as a V-to-I converter 444, a programmable mirror 446, a feedback amplifier 410 and a reference device 460. The switches 430 and 431 are controlled by controller 420 and provide a bandgap voltage $V_{BG}$ to both of the sections 860 and 862 when the switches 430 and 431 are engaged so as to receive the bandgap voltage $V_{BG}$. Alternatively, the switches 430 and 431 may be switched so as to receive an external bias voltage from an external source via input A. This external bias voltage may then be provided to each of the sections 860 and 862. Alternatively switches 430 and 431 may be configured to receive external bias voltages from separate inputs and/or different external voltage bias sources.

Furthermore, the configurable amplifier and bias control can be implemented in software, hardware, or a combination of software and hardware. In one embodiment, selected portions of the configurable amplifier and bias control are implemented in hardware and software. The hardware portion of the invention can be implemented using specialized hardware logic. The software portion can be stored in a memory and be executed by a suitable instruction execution system (microprocessor). The hardware implementation of the high efficiency multiple power level amplifier can include any or a combination of the following technologies, which are all well known in the art: a discrete logic circuit(s) having logic gates for implementing logic functions upon data signals, an application specific integrated circuit having appropriate logic gates, a programmable gate array(s) (PGA), a field programmable gate array (FPGA), etc.

Furthermore, the configurable amplifier and bias control software, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A communications device comprising:
   a radio frequency (RF) power amplifier fabricated with a first semiconductor material, the RF power amplifier configured to amplify an RF input signal; and
   a configurable bias controller fabricated with a second semiconductor material, the configurable bias controller comprising:
      a band gap voltage generator for generating a bandgap voltage;
      a voltage-to-current converter for generating a reference current in accordance with the bandgap voltage;
      a programmable current mirror for multiplying the reference current by a predetermined amount;
      a feedback amplifier for outputting a constant current in accordance with the multiplied reference current; and
      a reference device for receiving the constant current and providing a constant bias current to the RF power amplifier.

2. The communications device of claim 1, wherein said RF power amplifier is fabricated in the second semiconductor material.

3. The communications device of claim 1, wherein said second semiconductor material comprises complementary metal oxide semiconductor material.

4. The communications device of claim 1, wherein said first semiconductor material comprises gallium arsenide semiconductor material.

5. The communications device of claim 1, wherein said configurable bias controller and said RF power amplifier are fabricated on a common integrated circuit.

6. The communications device of claim 1, wherein said reference device is configured to provide a bias voltage output.

7. The communications device of claim 1, wherein said programmable current mirror provides said multiplied reference current to a power amplifier.

8. The communications device of claim 1, wherein said reference device is fabricated in said first semiconductor material.

9. The communications device of claim 1, wherein said configurable bias controller further comprises a switching device for alternatively providing said voltage-to-current converter with said bandgap voltage or a reference voltage provided by an external bias voltage source.

10. The communications device of claim 1, wherein said configurable bias controller is configured to turn off said bandgap voltage generator, said voltage-to-current converter and said programmable current mirror when they are not needed for operation of said communications device.

11. The communications device of claim 1, further comprising a radio frequency receiver.

12. The communications device of claim 11, wherein said radio frequency receiver comprises a personal communications system (PCS) compliant receiver.

13. The communications device of claim 11, wherein said radio frequency receiver comprises a code division multiple (CDMA) compliant receiver.

14. The communications device of claim 1, further comprising a global positioning satellite (GPS) receiver.

15. The communications device of claim 1, whereas said RF power amplifier comprises a multi-stage power amplifier.

16. A configurable bias controller comprising:
a band gap voltage generator for generating a bandgap voltage;
voltage-to-current converter for generating a reference current in accordance with said bandgap voltage;
a programmable current mirror for multiplying said reference current by a predetermined amount; and
a feedback amplifier for receiving the multiplied reference current and outputting and maintaining a constant current to a reference device.

17. The configurable bias controller of claim 16, further comprising a reference device for providing a bias voltage output.

18. The configurable bias controller of claim 17, wherein said bandgap voltage generator, said voltage-to-current converter and said programmable current mirror are fabricated in a first semiconductor material.

19. The configurable bias controller of claim 17, wherein said reference device is fabricated in a second semiconductor material.

20. The configurable bias controller of claim 16, wherein said configurable bias controller is configured to turn off said bandgap voltage generator, said voltage-to-current converter and said programmable current mirror when they are not needed for operation.

21. The configurable bias controller of claim 16, wherein said configurable bias controller is fabricated on an integrated circuit common with a power amplifier.

22. A configurable bias controller comprising:
a band gap voltage generator for generating a bandgap voltage;
an external bias voltage source for supplying an external bias voltage;
a switching device for receiving the bandgap voltage and the external bias voltage and providing a voltage selected from the bandgap voltage or the external bias voltage;
a voltage-to-current converter for generating a reference current in accordance with the selected voltage provided by the switching device;
a programmable current mirror for multiplying the reference current by a predetermined amount;
a feedback amplifier for outputting a constant current in accordance with the multiplied reference current; and
a reference device for receiving the constant current.

* * * * *